United States Patent [19]

Aubert et al.

[11] Patent Number: 4,862,085

[45] Date of Patent: Aug. 29, 1989

[54] METHOD OF REGULATING THE MAGNETIC FIELD DELIVERED BY A RESISTIVE MAGNET, A RESISTIVE MAGNET SYSTEM USING THIS METHOD AND AN INSTALLATION FOR FORMING IMAGES BY NUCLEAR MAGNETIC RESONANCE INCORPORATING SUCH A SYSTEM

[75] Inventors: Guy Aubert, Grenoble; Daniel Kaplan, Paris, both of France

[73] Assignee: Thomson-CGR, Paris, France

[21] Appl. No.: 191,799

[22] PCT Filed: Nov. 29, 1985

[86] PCT No.: PCT/FR85/00342

§ 371 Date: Oct. 3, 1986

§ 102(e) Date: Oct. 3, 1986

[87] PCT Pub. No.: WO86/03857

PCT Pub. Date: Jul. 3, 1986

Related U.S. Application Data

[63] Continuation of Ser. No. 901,511, Oct. 3, 1986, abandoned.

[30] Foreign Application Priority Data

Dec. 14, 1984 [FR] France .............................. 84 19190

[51] Int. Cl.⁴ ............................................ G01N 24/06
[52] U.S. Cl. .................................... 324/315; 324/320
[58] Field of Search ............... 324/315, 318, 319, 320, 324/322; 335/299; 361/146; 62/96, 434

[56] References Cited

FOREIGN PATENT DOCUMENTS 0830213  5/1981  U.S.S.R. .............................. 324/322

OTHER PUBLICATIONS

*J. Phys. E; Sci. Instrum.*, vol. 11, 1978, No. 9, "Clamping of Bitter Coils by a Fibreglass Cylindrical Housing", K. Trojnar, B. Drys, and M. Luczak.

*Revue de Physique Appliquee* (France), No. 3, Mars 1979, p. 517, "Asservissement d'un champ magnétique statique, Dans la gamme 0,1 à 2 T, par R.M.N. impulsionnelle; optimalisation des performances", J. Alizon, J. P. Dagois, H. Robert.

*Science*, vol. 122, "Magnets and Magnetic Field Measurements", A. L. Bloom, M. E. Packard.

*IEEE Transactions on Magnetics*, vol. Mag-17, No. 5, Sep. 1981, "Polyhelix Magnets", H.-J. Schneider-Muntau.

Primary Examiner—Stewart J. Levy
Assistant Examiner—Laurence G. Fess
Attorney, Agent, or Firm—Oblon, Spivak, McClelland, Maier, & Neustadt

[57] ABSTRACT

A system is provided for regulating the field of a high homogeneity magnet. The fluid used for cooling the main magnet is placed in thermal contact with a high homogeneity auxiliary magnet in which is placed an NMR probe which controls the current supply to the two magnets connected in series.

15 Claims, 4 Drawing Sheets

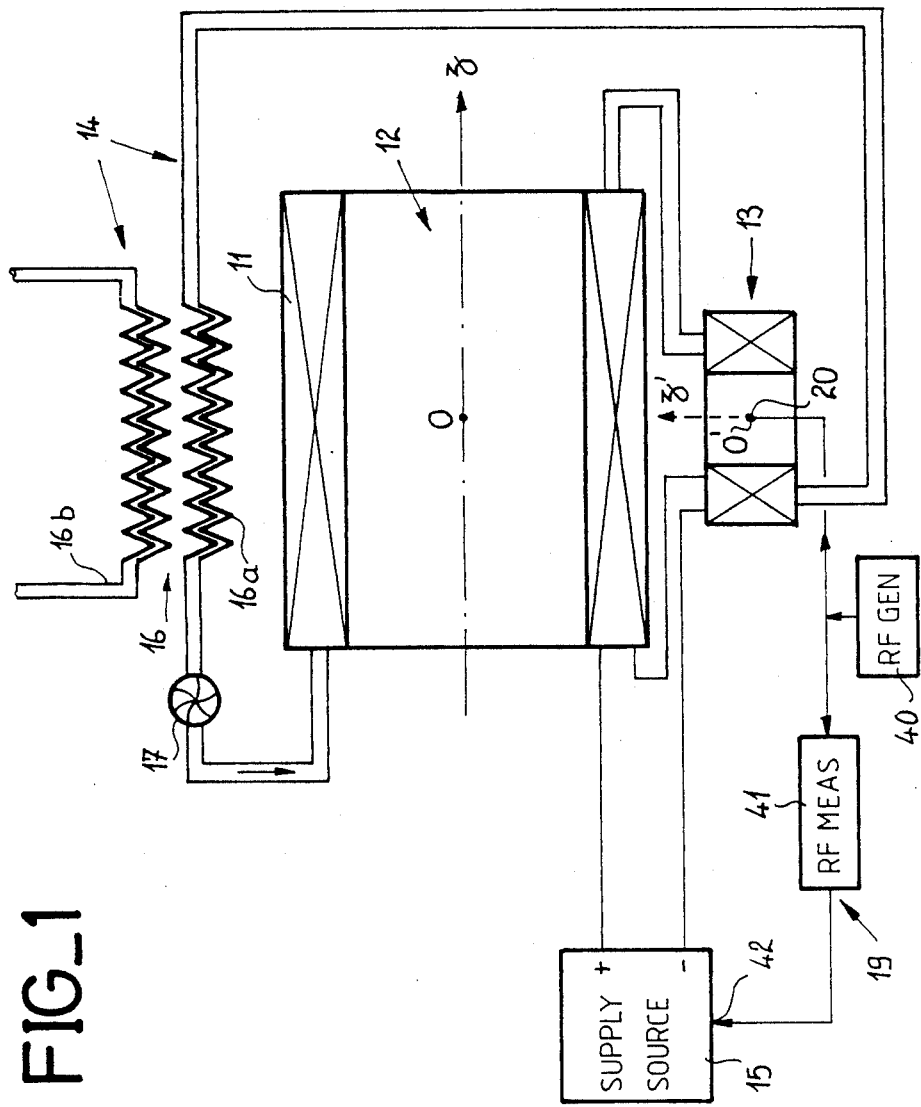
FIG_1

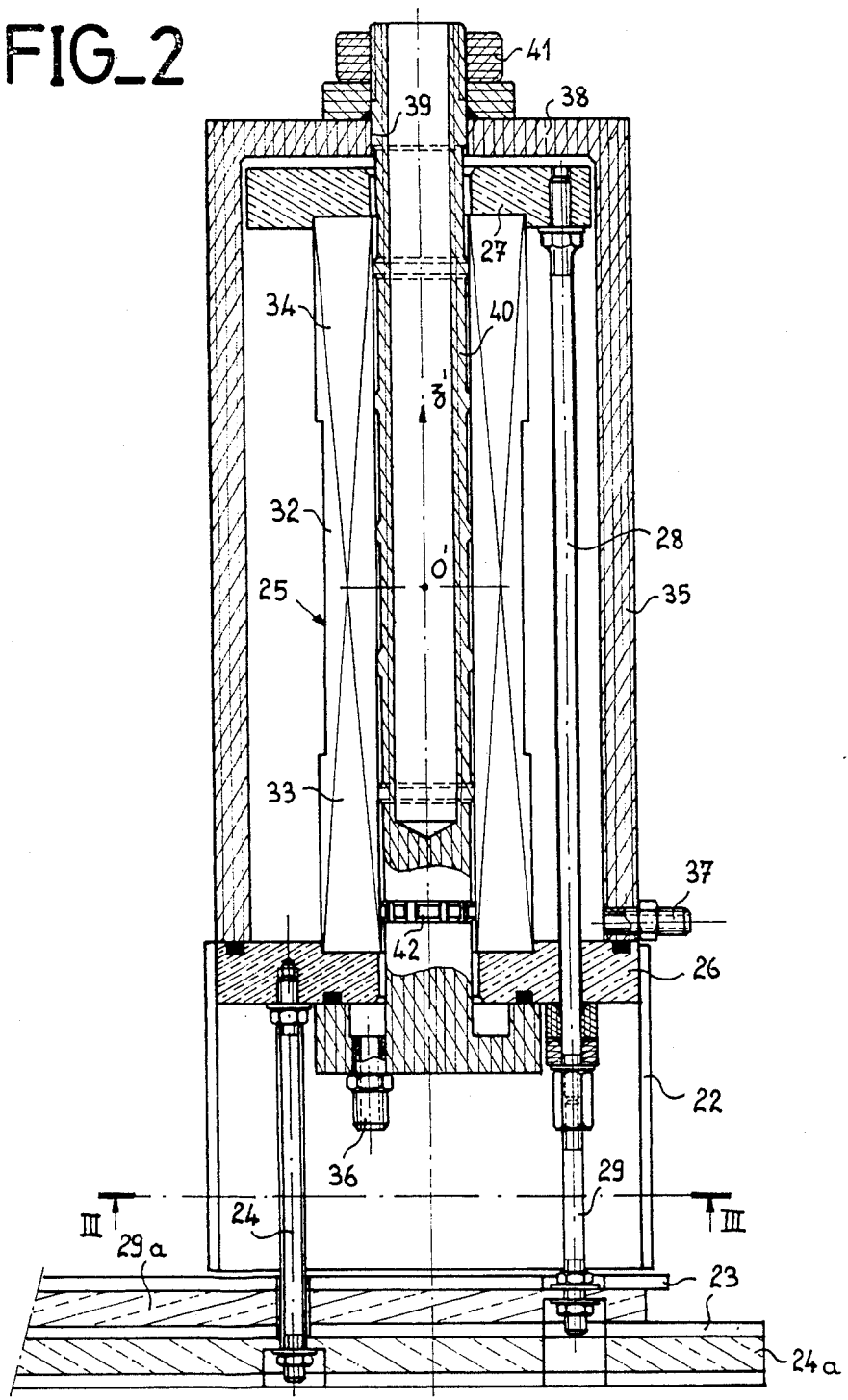

FIG_3
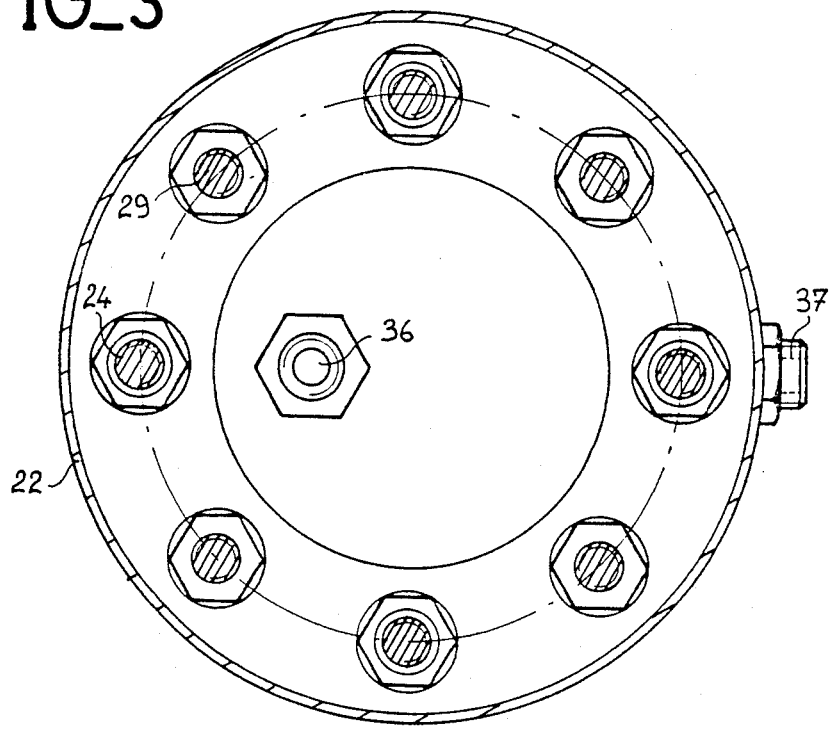
FIG_4
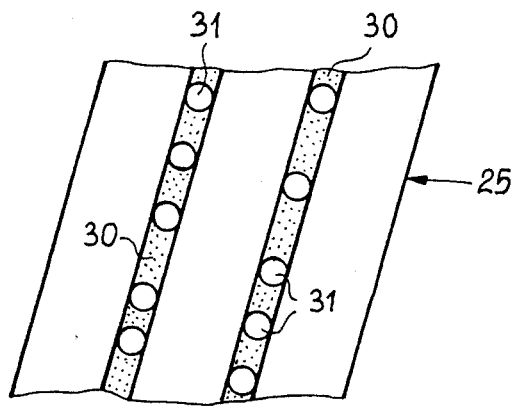

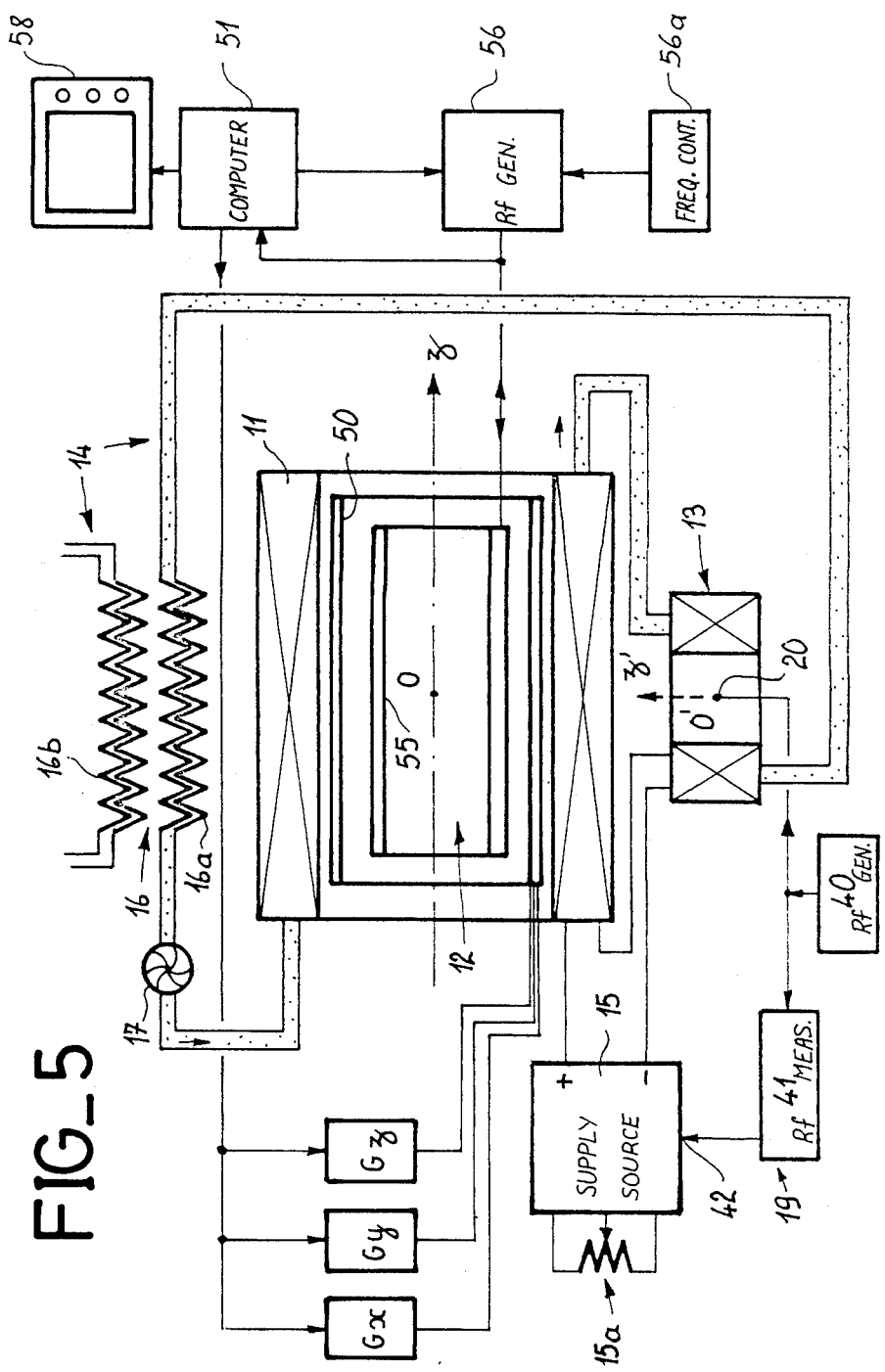
FIG_5

METHOD OF REGULATING THE MAGNETIC FIELD DELIVERED BY A RESISTIVE MAGNET, A RESISTIVE MAGNET SYSTEM USING THIS METHOD AND AN INSTALLATION FOR FORMING IMAGES BY NUCLEAR MAGNETIC RESONANCE INCORPORATING SUCH A SYSTEM

This application is a continuation of Ser. No. 901,511, filed on Oct. 3, 1986, now abandoned.

BACKGROUND OF THE INVENTION

The invention relates to a method for regulating the magnetic field delivered by a resistive magnet for eliminating any drifting of this field due more particularly to the temperature variations caused mainly by the Joule effect dissipation of the magnet itself; the invention also relates to a resistive magnet system using this method and, by way of application, an installation for forming images by nuclear magnetic resonance (NMR) incorporating such a system.

It is known that NMR image forming installations, among others, require a large sized magnet capable of generating a uniform magnetic field, called: basic field, in a given region in space. Typically, it is necessary to generate a field of 0.15 to 0.5 teslas with a homogeneity of 1 to 10 parts per million (ppm) in a sphere of a diameter of 50 cm at least.

Among the different types of magnets currently used for creating such fields, there may be mentioned the resistive magnets formed of one or more coils arranged, very often without a ferromagnetic shrouding, so as to obtain the required homogeneity. The stabilization of the operating point of such a magnet requires a considerable time for it is impossible to determine the value of the field in the center of the "sphere of homogeneity" because this volume is reserved for the patient and means for measuring the field cannot be installed therein and especially because, during operation, the magnetic field is disturbed by the subsidiary fields generated by the gradient coils of the NMR image forming installation.

The stability and uniformity of the magnetic field are then only really acquired when the temperature of the magnet has become completely stabilized, which does not exclude subsequent drifting, which is difficult to master. Because of all these difficulties, it has never been a question up to now of considering the value of the basic field as a parameter capable of being chosen by the operator in NMR image formation.

The purpose of the invention is to overcome all the disadvantages of the prior technique mentioned above.

SUMMARY OF THE INVENTION

To this end, the invention provides a method of regulating the magnetic field delivered by a main resistive magnet cooled by a fluid flow and creating a field of required homogeneity in a given region in space, which consists:

in electrically supplying an auxiliary magnet and the main magnet from an adjustable common DC source, in placing said auxiliary magnet in thermal contact with said fluid so that said auxiliary magnet is substantially at the temperature of said main magnet, in measuring a reference magnetic field representative of the main field and created by said auxiliary magnet, and in adjusting said DC source common to the two magnets so as to stabilize said reference field at a chosen value.

Preferably, the two magnets are connected in series and the value of the current which flows therethrough is varied.

According to another important feature of the invention, the reference magnetic field is measured by using the nuclear magnetic resonance phenomenon on a sample of chosen atoms, placed in a zone of said reference magnetic field where this latter has sufficient homogeneity for using said phenomenon.

"NMR" probes containing said sample of chosen atoms are known and proposed commercially. It is desirable for the homogeneity of the reference magnetic field to be large (comparable to that of the field of the main magnet) throughout the zone occupied by the sample so that the resultant NMR phenomenon concerns the largest number possible of nuclei of the sample and gives rise to a detectable phenomenon, the conditions of magnetic resonance being as is known directly related to the value of the magnetic field and to that of the frequency of excitation of the nuclei.

The invention also relates to a resistive magnet system, more particularly for generating a field having the required homogeneity in a given region in space, of the type comprising a main resistive magnet thermally coupled to a cooling fluid flow circuit and means for electrically supplying this magnet, which system further includes an auxiliary magnet thermally coupled to said cooling fluid flow circuit and fed by said electric supply means, said auxiliary magnet being of small size compared with said main magnet for creating a reference field representative of the field of said main magnet in a restricted volume, and further including means for measuring the reference field placed in said restricted volume and a loop for the servo control of said supply means driven by said means measuring the reference field.

Preferably, said main magnet has a Bitter magnet structure and the coils of the main magnet and of the auxiliary magnet are formed from the same conducting material, particularly copper or aluminium.

The invention also relates, by way of application, to an NMR image forming installation, including a resistive magnet system for generating a basic magnetic field having the required homogeneity in a given region of space, a system of gradient coils for superimposing, on said basic field, field gradients of different predetermined intensities and orientations during chosen sequences, radio frequency transmission-reception means for transmitting and receiving radio frequency signals in said region of space during said sequences and computing means for reconstituting an image from the radio frequency signals received by said transmission-reception means, said resistive magnet system having a main resistive magnet thermally coupled to a cooling fluid flow circuit and means for electrically supplying this magnet, in which installation said resistive magnet system further includes an auxiliary magnet firmly coupled to said cooling fluid flow circuit and supplied electrically by said electric supply means, said auxiliary magnet being of small size compared with said main magnet for creating a reference field representative of the main field in a restricted volume, said system further including means for measuring the reference field placed in said restricted volume and a chain for the servo control of said supply means driven by said reference field measuring means, and the reference value of said servo control chain is adjustable for generating several basic field values and said radio frequency transmission-reception means are adapted for operating at different frequencies corresponding respectively to the basic field value so as to obtain images acquired from different NMR conditions. It has in fact been verified that with the above described magnet system, stabilization of the magnetic field was obtained in a few minutes; it is then possible to envisage acquiring images with different predetermined basic field values, by completing the usual apparatus of an NMR installation, particularly the transmission-reception means which must be able to operate at different frequencies corresponding to the NMR conditions for the different basic field values so as to obtain, during the same examination, similar images of the patient acquired at short time intervals from different NMR conditions. This considerably increases the possibilities of diagnosis by choosing the NMR conditions the best adapted to the region of the body under examination and/or by comparing the images obtained from different NMR conditions.

BRIEF DESCRIPTION OF THE DRAWINGS

The invention will be better understood and other advantages thereof will be clearer from the following description, given solely by way of example, with reference to the accompanying drawings in which:

FIG. 1 is a block diagram of the magnet system formed in accordance with the invention;

FIG. 2 is a detail view of the installation showing the structure of the auxiliary magnet, in longitudinal section;

FIG. 3 is a section through III—III of this auxiliary magnet;

FIG. 4 is a detailed view of the turns of the auxiliary magnets; and

FIG. 5 is a block diagram of an NMR image forming installation incorporating the magnet system of FIG. 1.

DESCRIPTION OF THE PREFERRED EMBODIMENT

The system shown in FIG. 1 is formed essentially of a large sized resistive magnet 11 designed for creating a relatively intense and very homogeneous magnetic field in the region 12 of its internal volume, a small sized auxiliary magnet 13, a cooling fluid flow circuit 14 in thermal contact with magnets 11 and 13, and a servo control DC source 15 connected in series with the coils of the two magnets.

As mentioned above, for an NMR image forming application, magnet 11 is designed for generating a magnetic field between 0.1 and 0.5 teslas in a sphere of 50 cm in diameter with center O (the center of symmetry of the magnet) with a homogeneity of 1 to 10 ppm.

Preferably, the main magnet 11 comprises at least one Bitter coil. By "Bitter coil" is meant a coil formed of annular metal disks (typically made from copper or aluminium) defining turns of a solenoid, these disks being electrically isolated from each other (very often with interpositioning of isolating foils of similar shape) but connected end to end so as to form said solenoid, whereas holes are formed in the rings and the insulators defining channels extending substantially parallel to the longitudinal axis of the solenoid and in which the cooling fluid flows.

In all cases, the magnet 11 has a structure allowing an efficient heat exchange between the windings of the resistive coil or coils forming it and the cooling fluid. The same goes for magnet 13 which is arranged, as will be seen further on, for receiving the same cooling fluid so as to be always substantially at the same temperature as the main magnet. It should be noted in this connection that the internal resistance of the auxiliary magnet is very low with respect to that of the main magnet so that its contribution to heating of the fluid flowing in circuit 14 is practically negligible. Furthermore, the coils of the two magnets 11 and 13 are made from the same conducting material, particularly copper or aluminium. Circuit 14 further includes a circulation pump 17 and an exchanger 16 whose secondary circuit 16b has the cooling fluid flowing therethrough and whose primary circuit 16 a is supplied with cold circulating water. In the example shown, circuit 14 is designed so that the whole of the cooling fluid passes through the auxiliary magnet 13, but it is possible, with an appropriate by-pass, to cause only a part of this fluid flow through magnet 13 as long as the temperature thereof is always substantially equal to that of magnet 11 at all times. To this end, it is particularly important for circuit 14 to be adapted so that the fluid entering the magnet 13 comes directly from the main magnet 11, without passing through the exchanger 16.

Moreover, as mentioned above, the coils of magnets 11 and 13 have, at all times, the same current passing therethrough delivered by the current source 15. The purpose of magnet 13 is to create a reference magnetic field representative of the field of the main magnet in at least one restricted volume of its internal space where means are placed for measuring said reference field, for driving a loop 19 controlling the current delivered by the DC source 15. In a preferred embodiment, these field measuring means include an NMR probe 20 for driving the control loop 19, said probe being placed in said restricted volume. So as to obtain a usable NMR signal, the auxiliary magnet 13 is constructed so that the reference field has sufficient homogeneity in the restricted volume where the probe is placed. In practice, the homogeneity of the reference field in the volume surrounding the probe must be from one to 10 ppm, that is to say of the same order of size as the homogeneity of the basic field in the useful volume of the main magnet.

Magnets 11 and 13 each have a longitudinal axis of symmetry, respectively OZ and O'Z', O and O' being the centers of symmetry of these magnets. According to an advantageous feature of the invention, the axis O'Z' of the auxiliary magnet 13 is placed substantially in a median transverse plane (containing the point O) of the main magnet 11 so as to intersect the axis OZ at point O, magnet 13 of course remaining outside magnet 11. This arrangement is the one which offers the lowest possible parasite coupling between the two magnets and which therefore least disturbs the homogeneity of the two fields.

With the above described system, the current delivered by the DC source 15 is permanently adjusted so as to regulate the value of the field bo in the magnet 13. This field is of the form:

$$b_0 = b(1 + a T)I$$

where T is the temperature, I the current and a, b constants.

However, with the above mentioned conditions, the basic field Bo is also of the form:

$$B_o = B(1 + aT)I$$

a and B being constants.
Consequently:

$$B_o/b_o = c^{te}$$

Regulation of the field bo causes then regulation of the field Bo. Regulation of the same type may be obtained with the magnets connected in parallel to a DC source controlled in a similar way.

The structure of an auxiliary magnet suitable for the contemplated application will now be described with reference to FIGS. 2 to 4. This magnet is formed of a coil 25 with helical turns clamped between two end metal flanges 26, 27 (forming annular current distributing plates by means of tie rods 28 spaced evenly apart over a cylindrical area coaxial with the axis O'z'. The tie rods 28 are in electrical contact with flange 27 and electrically isolated from coil 25 and flange 26. Flange 26 is electrically connected by as many metal rods 24 as there are tie rods to an electric connecting piece 24a. These rods are disposed over the same cylindrical area as tie rods 28 and are equidistant therefrom (see FIG. 3). The ends of tie rods 28 are extended by as many metal rods 29 electrically connected to another electric connecting piece 29a parallel to piece 24a. Rods 24 are isolated from piece 29a which they pass through. The currents flow in reverse directions in rods 24, 29 and piece 24, 29a so that the magnetic field which they create in the vicinity of the center O' of the magnet is negligible. Insulating material plate 23 are inserted between the base 22 of the auxiliary magnet and piece 29a, on the one hand and between pieces 29a and 24a on the other. The tie rods 28 participate in the electric connection of coil 25, while compensating for its axial current component due to the helical pitch of the winding.

Structurally, coil 25 results from machining a helix in a tubular cylindrical portion of the chosen metal (longer than the desired coil) and the axial compression of this helix so as to form a coil with jointing turns. These turns are bonded together by an insulating bonding agent 30 in which are incorporated small calibrated glass balls 31 maintaining a very small constant dielectric spacing between adjacent turns (see FIG. 4). To homogenize the reference field in the zone about center O', sufficient for receiving the NMR probe 20, the section of the central turns has been modified with respect to the end turns. For that, the central portion 32 of the coil is machined so as to give it a smaller external diameter than that of the two adjacent end portions 33, 34. The length of the central portion 32 and the difference of diameters are chosen so as to obtain the required homogeneity. The coil which has just been described is housed in a sealed case 35 having connecting orifices 36, 37 for its insertion in the cooling fluid circuit 14.

More precisely, the cylindrical case 35 made from an insulating material is completely open at one of its axial ends and this end rests on the edge of flange 26 which is larger than flange 27. The other axial end of the case has a wall 38 with a hole 39 formed therein for passing therethrough an insulating hollow mandrel 40 inside which the probe 20 will be housed. This mandrel has a shoulder at one end, bearing against the external surface of flange 26 and in which orifice 36 is formed. Its other end has a threaded portion projecting out of hole 39 and a nut 41 is engaged on this threaded portion tightening thereof providing the sealed closure of case 35. Mandrel 40 has on its external surface annular grooved reliefs 42, maintaining an annular passage for the flow of the fluid between the mandrel and the internal surface of coil 25. Since orifice 37 is formed in the side wall of case 35, the fluid is in the thermal contact with the internal and external walls of coil 25 so that this latter is always at the temperature of the cooling fluid.

By way of example, a magnet such as shown in FIGS. 2 to 4 and having the required field homogeneity qualities includes a copper coil 25 having the following characteristics:

total length : 310 mm
internal diameter : 38 mm
length of the central portion : 137.54 mm
external diameter of the central portion : 81.42 mm
external diameter of the end portions : 92 mm The servo control loop 19 is known and its components are commercially available, particularly for spectrometry applications. The NMR probe 20 has a coupling coil surrounding the above mentioned sample and the control loop 19 includes essentially a radio frequency generator 40 feeding the coupling coil and transmitting a time variable frequency signal. A sweep of a certain frequency range including the NMR frequency is therefore applied to the probe. Furthermore, the control loop 19 also includes means 41 for measuring the radio frequency signal at the terminals of said coupling coil. When the generator is at the NMR frequency of the sample, an energy absorption phenomenon occurs and the radio frequency signal at the terminals of the coil is very greatly attenuated. The drift of the absorption signal is compared with a reference for elaborating the error signal applied to the drive input 42 of the supply source 15. The variable frequency sweep is repeated regularly so as to constantly update the value of the error signal applied to the drive input 42.

An NMR image forming installation will now be briefly described with reference to FIG. 5, comprising a magnet system such as described with reference to FIGS. 1 to 4 for forming the basic field. Similar structural elements bear the same reference numbers and will not be described again.

The installation is also provided with a correction coil system (called "shims" known per se and not shown) the purpose of which is essentially to compensate for the disturbing effects of the environment of the magnet. Magnet 11 which forms the basic field is associated with a gradient coil system 50, known per se, the gradient coils being arranged on a cylindrical tubular mandrel placed inside the internal space 12 of magnet 11, coaxially to axis OZ. The gradient coil system is completed by an assembly of DC power supplies (Gx, Gy, Gz) controlled in accordance with a cycle of sequences preprogrammed in a computer 51 for feeding the gradient coils so as to superimpose on the basic field magnetic field gradients of different predetermined intensities and orientations during said sequences. It is known that these gradients permit, among other things, the sectional plane to be selected of which it is desired to reconstruct the image. A radio frequency antenna system 55 is also housed inside the useful space 12 of magnet 11. These antennae form part of the radio frequency transmission-reception means, further including a radio frequency generator 56 driven by the computer 51 for generating calibrated radio frequency signal pulses during said sequences. The NMR signals retransmitted by the subject during examination are picked up by the same antenna system and used by a computing unit of computer 51 applying known algorithms for reconstituting an image. This image is for example displayed on a cathode ray tube of a television receiver 58.

In accordance with the invention, during examination of the same patient, information may be required necessary for reconstructing several similar images (that is to say several images of the same section of the subject) provided that the current source 15 includes means 15a for adjusting its reference value, so as to cause magnet 11 to operate at different chosen basic magnetic field values. Of course, since the NMR conditions for a given magnetic field value require a given transmission frequency, the transmission-reception means and particularly the generator 56 are also adapted for operating at different frequencies. The generator must then include a control 56a for causing it to oscillate at a frequency corresponding to the value of the chosen basic field. The design of the subassemblies such as the variable reference current source and the adjustable frequency radio frequency generator is within the scope of a man versed in the art. This progress is important in NMR image formation since, on the one hand, the NMR conditions best adapted to the nature of the tissues in the section of the patient under examination can be chosen and similar images obtained under different NMR conditions at short time intervals may be compared for improving the diagnosis. This progress has been made possible by the fact that stabilization of the basic field in the internal space 12 of magnet 11 is extremely rapid (a few minutes whereas it required hours previously) which allows the value of the basic field to be changed without the installation being unusable for long periods and similar images to be acquired without the patient having to remain in space 12 for too long a time.

What is claimed is:

1. A method of regulating a magnetic field delivered by a main resistive magnet cooled by a fluid flow and creating a field having the required homogeneity in a given region in space, including:

supplying an auxiliary magnet and a main magnet electrically from a common adjustable DC source, placing said auxiliary magnet in thermal contact with said fluid so that said auxiliary magnet is substantially at the temperature of said main magnet, measuring a reference magnetic field representative of said main field and created by said auxiliary magnet, and adjusting said DC source common to the two magnets for stabilizing said reference field at a chosen value.

2. The regulation method as claimed in claim 1, wherein the two magnets are connected in series and the value of the current flowing therethrough is adjusted so as to stabilize said reference field.

3. The regulation method as claimed in claim 1, wherein said reference magnetic field is measured using the phenomenon of nuclear magnetic resonance on a sample of chosen atoms, placed in a zone of said reference magnetic field where this latter has sufficient homogeneity for using said phenomenon.

4. A resistive magnet system, more particularly for generating a field of required homogeneity in a given region of space, of the type including a main resistive magnet thermally coupled to a cooling fluid flow circuit and means for supplying this magnet with electricity, which system further includes an auxiliary magnet thermally coupled to said cooling fluid circuit and supplied electrically by said electric supply means, said auxiliary magnet being of small size compared with said main magnet so as to create a reference field representative of the main field in a restricted volume, and further including means for measuring the reference field placed in said restricted volume and a loop for controlling said supply means driven by said reference field measuring means.

5. The system as claimed in claim 4, wherein the two magnets are connected electrically in series, said control chain regulating the current delivered by said electric supply means.

6. The system as claimed in claim 4, or 5, wherein said fluid flow circuit is arranged to cool said main magnet and to cause at least a part of said fluid heated by said main magnet to pass in thermal contact with said auxiliary magnet so as to bring this substantially to the same temperature as that of the main magnet.

7. The system as claimed in claim 4, wherein said auxiliary magnet is constructed so that the reference field in said reduced volume has sufficient homogeneity for using an NMR phenomenon, and said reference field measuring means comprise an NMR probe known per se.

8. The system as claimed in one of claims 4 to 5, wherein said main magnet and said auxiliary magnet each have a longitudinal axis of symmetry, the axis of said auxiliary magnet is placed substantially in a median transverse plane of said main magnet, so as to intersect the axis of this latter.

9. The system as claimed in one of claims 4 to 5, wherein the coils of the main magnet and of the auxiliary magnet are made from the same conducting material, more particularly copper or aluminium.

10. The system as claimed in one of claims 4 to 5, wherein said main magnet is essentially formed of one or more Bitter coils.

11. The system as claimed in one of claims 4 to 5, wherein said auxiliary magnet includes a coil with helical turns, clamped between two metal end flanges by tie rods spaced evenly apart over a cylindrical area coaxial with the axis of said coil and said tie rods are in electric contact with one of the flanges and electrically isolated from said coil and from the other flange so as to participate in the electric connection of said coil while compensating for the axial component of the current vector due to the helical pitch of said coil.

12. The system as claimed in claim 11, wherein said coil with helical turns results from machining a helix in a cylindrical tubular portion and the axial compression of this helix.

13. The system as claimed in claim 11, wherein the turns of said coil are bonded together with an insulating bonding agent comprising calibrated glass balls.

14. The system as claimed in claim 13, wherein a central portion of said coil has an outer diameter smaller than that of the two adjacent end portions so as to improve the homogeneity of said reference field inside said coil.

15. An NMR image forming installation, having a resistive magnet system for generating a basic magnetic field of required homogeneity in a given region in space, a system of gradient coils for superimposing, on said basic field, field gradients of different predetermined intensities and orientations during chosen sequences, radio frequency transmission-reception means for transmitting and receiving radio frequency signals in said region of space during said sequences and computing means for reconstituting an image from the radio frequency signals received by said transmission-reception means, said resistive magnet system including a main resistive magnet thermally coupled to a cooling fluid flow circuit and means for supplying this magnet with electricity, in which installation said resistive magnet system further includes an auxiliary magnet thermally coupled to said cooling fluid flow circuit and supplied electrically by said electric supply means, said auxiliary magnet being small in size compared with said main magnet for creating a reference field representative of said main field in the restricted volume, and further including means for measuring the reference field placed in said restricted volume and a loop for controlling said supply means driven by said reference field measuring means, the reference value of said control loop is adjustable for generating several basic field values and said radio frequency transmission-reception means are adapted for operating at different frequencies corresponding respectively to said basic field values so as to obtain acquired images from different NMR conditions.

* * * * *